(12) United States Patent
Hai et al.

(10) Patent No.: US 10,036,772 B2
(45) Date of Patent: Jul. 31, 2018

(54) SIGNAL TESTING APPARATUS FOR PRINTED CIRCUIT BOARD

(71) Applicants: Boe Technology Group Co., Ltd., Beijing (CN); Beijing Boe Display Technology Co., Ltd., Beijing (CN)

(72) Inventors: Chunxi Hai, Beijing (CN); Runcong Ge, Beijing (CN); Lingxiao Hou, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/325,838

(22) PCT Filed: Jul. 6, 2016

(86) PCT No.: PCT/CN2016/088804
§ 371 (c)(1),
(2) Date: Jan. 12, 2017

(87) PCT Pub. No.: WO2017/063395
PCT Pub. Date: Apr. 20, 2017

(65) Prior Publication Data
US 2017/0292988 A1    Oct. 12, 2017

(30) Foreign Application Priority Data
Oct. 14, 2015   (CN) .......................... 2015 1 0661010

(51) Int. Cl.
*G01R 31/28*    (2006.01)
(52) U.S. Cl.
CPC .................. *G01R 31/281* (2013.01)

(58) Field of Classification Search
CPC .............. G01R 31/281; G01R 31/2805; G01R 31/2808
See application file for complete search history.

(56) References Cited

U.S. PATENT DOCUMENTS 5,570,027 A  * 10/1996  Stans ................. G01R 31/2805
                                                                324/523
6,043,442 A     3/2000   Park et al.
(Continued)

FOREIGN PATENT DOCUMENTS

CN          1161455 A      10/1997
CN          101435841       5/2009
(Continued)

OTHER PUBLICATIONS

International Search Report for PCT/CN2016/088804 dated Aug. 29, 2016.
(Continued)

*Primary Examiner* — Giovanni Astacio-Oquendo
*Assistant Examiner* — Alvaro Fortich
(74) *Attorney, Agent, or Firm* — Calfee, Halter & Griswold LLP

(57) ABSTRACT

A signal testing apparatus for a printed circuit board is disclosed which includes a plurality of input terminals for receiving an external testing signal, a plurality of output terminals for supplying the printed circuit board with the external testing signal, a plurality of switches arranged between the plurality of input terminals and the plurality of output terminals for controllably coupling the plurality of input terminals to the plurality of output terminals, an ammeter for measuring a magnitude of a current on a first path provided by the coupling of the plurality of switches,
(Continued)

and a voltmeter for measuring a magnitude of a voltage on a second path provided by the coupling of the plurality of switches.

12 Claims, 2 Drawing Sheets

(56) References Cited

U.S. PATENT DOCUMENTS

| | | | | |
|---|---|---|---|---|
| 6,458,608 | B1* | 10/2002 | Hong | H05K 3/361 |
| | | | | 438/14 |
| 2002/0080316 | A1* | 6/2002 | Tsai | G02F 1/13452 |
| | | | | 349/149 |
| 2007/0282548 | A1* | 12/2007 | Ling | G01M 13/025 |
| | | | | 702/65 |
| 2008/0054917 | A1* | 3/2008 | Henson | G01R 31/2889 |
| | | | | 324/754.03 |
| 2009/0108851 | A1* | 4/2009 | Chen | G01R 31/2808 |
| | | | | 324/555 |
| 2009/0128173 | A1 | 5/2009 | Wong et al. | |
| 2010/0138800 | A1* | 6/2010 | Kobayashi | G06F 17/5068 |
| | | | | 716/115 |
| 2013/0116949 | A1* | 5/2013 | Yang | G01R 31/00 |
| | | | | 702/58 |
| 2014/0028343 | A1* | 1/2014 | Numata | G01R 1/06722 |
| | | | | 324/763.01 |
| 2014/0354316 | A1* | 12/2014 | Matsuoka | G01R 31/2887 |
| | | | | 324/750.24 |
| 2015/0028892 | A1* | 1/2015 | Yeh | G01R 27/02 |
| | | | | 324/654 |

FOREIGN PATENT DOCUMENTS

| | | |
|---|---|---|
| CN | 101435841 A | 5/2009 |
| CN | 102508485 | 6/2012 |
| CN | 102508485 A | 6/2012 |
| CN | 203396869 | 1/2014 |
| CN | 104407254 | 3/2015 |
| CN | 104407254 A | 3/2015 |
| CN | 105301476 | 2/2016 |
| JP | 2007104353 | 4/2007 |
| JP | 2007104353 A | 4/2007 |

OTHER PUBLICATIONS

First Office Action for Chinese Patent Application No. 201510661010.4 dated Sep. 4, 2017.
Second Office Action for Chinese Patent Application No. 201510661010.4 dated Jan. 29, 2018.

* cited by examiner

SIGNAL TESTING APPARATUS FOR PRINTED CIRCUIT BOARD

CROSS-REFERENCE TO RELATED APPLICATIONS

The present application is the U.S. national phase entry of PCT/CN2016/088804, with an international filing date of Jul. 6, 2016, which claims the benefit of Chinese Patent Application No. 201510661010.4, filed on Oct. 14, 2015, the entire disclosures of which are incorporated herein by reference.

TECHNICAL FIELD

The present disclosure relates to the field of testing technology, and particularly to a signal testing apparatus for a printed circuit board.

BACKGROUND

In debugging or final factory inspection of electronic products (e.g., display panels), a problem with existing signal analysis instruments, such as oscillometers, is that their operations are too complex to meet production demand.

FIG. 1 shows a printed circuit board (PCB) in a liquid crystal display (LCD). There are a number of testing points on the PCB. In the final factory inspection, operators have to measure electrical characteristics (e.g., current, voltage and the like) of intended testing points one by one through finding out all of them. This is rather troublesome.

Therefore, there is a need for an improved signal testing apparatus for a printed circuit board.

SUMMARY

It would be advantageous to provide a signal testing apparatus for a printed circuit board, which may simplify measurement process and increase degree of automation of measurement.

According to an aspect of the present disclosure, A signal testing apparatus for a printed circuit board is provided, comprising: a plurality of input terminals for receiving an external testing signal; a plurality of output terminals for supplying the printed circuit board with the external testing signal; a plurality of switches arranged between the plurality of input terminals and the plurality of output terminals for controllably coupling the plurality of input terminals to the plurality of output terminals; an ammeter for measuring a magnitude of a current on a first path provided by the coupling of the plurality of switches; and a voltmeter for measuring a magnitude of a voltage on a second path provided by the coupling of the plurality of switches.

In some embodiments, the plurality of switches may comprise a plurality of first switches each having a terminal connected to a respective one of the plurality of input terminals and another terminal connected to a respective one of the plurality of output terminals.

In some embodiments, the plurality of switches may comprise a second switch for selectively connecting one of the plurality of input terminals to a first terminal of the ammeter, and a third switch for selectively connecting one of the plurality of output terminals to a second terminal of the ammeter.

In some embodiments, the second switch and the third switch may be configured to operate such that the plurality of input terminals corresponds one-to-one with the plurality of output terminals.

In some embodiments, the plurality of first switches, the second switch and the third switch may be configured such that when one of the plurality of first switches is turned off, the second switch and the third switch are turned on to couple the input terminal connected with the turned-off first switch to the output terminal connected with the turned-off first switch via the ammeter.

In some embodiments, the plurality of first switches is configured such that only one of the plurality of first switches is turned off at any time.

In some embodiments, the voltmeter has a first terminal and a second terminal, the second terminal for connection to a reference terminal on the printed circuit board. The plurality of switches may comprise a fourth switch for selectively connecting one of the plurality of output terminals to the first terminal of the voltmeter.

In some embodiments, the fourth switch may be configured to operate synchronously with the second switch and the third switch such that the voltmeter measures the magnitude of the voltage on the first path when the ammeter measures the magnitude of the current on the first path.

In some embodiments, the plurality of switches is selected from the group consisting of a mechanical switch and an electronic switch.

In some embodiments, the plurality of switches is electronic switches, and the signal testing apparatus further comprises a controller for controlling the electronic switches.

In some embodiments, the controller is configured to control the electronic switches to operate such that the current and voltage on each of paths from the plurality of input terminals to the plurality of output terminals are measured by the ammeter and the voltmeter.

In some embodiments, the printed circuit board is a printed circuit board in an LCD panel.

These and other aspects of the present invention will be apparent from and elucidated with reference to the embodiment(s) described hereinafter.

DETAILED DESCRIPTION

Embodiments of the present disclosure will be described in detail in combination with the accompanying drawings.

In the procedure of PCB testing, the PCB is usually provided with a series of testing signals, which may be excitation signals that allow the PCB to work properly. With the excitation of the testing signals, the PCB operates to present particular electrical characteristics (e.g., current, voltage and the like) at testing points arranged thereon. By testing and comparing the electrical characteristics with target values, it can be determined whether the PCB breaks down.

Figure 1:
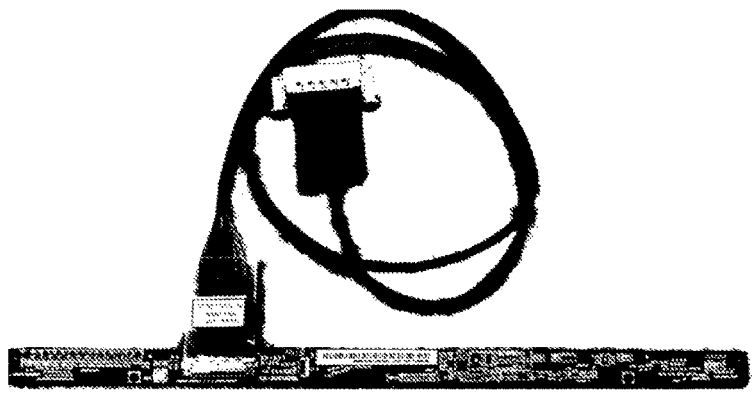
FIG. 1 shows a printed circuit board in a liquid crystal display.
Figure 2:
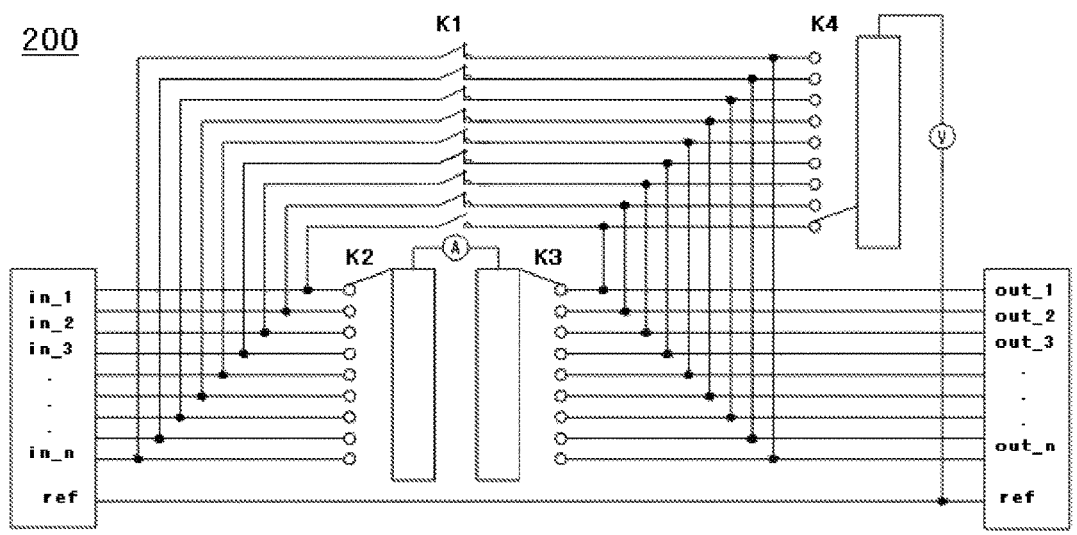
FIG. 2 shows a schematic diagram of a signal testing apparatus for a printed circuit board in accordance with an embodiment of the present disclosure.

FIG. 2 shows a schematic diagram of a signal testing apparatus 200 for a printed circuit board in accordance with an embodiment of the present disclosure.

As shown, the signal testing apparatus 200 includes a plurality of input terminals in_1, in_2, in_3 . . . in_n, a plurality of output terminals out_1, out_2, out_3 . . . out_n, a plurality of switches K1, K2, K3, K4, an ammeter (denoted by "A" in the figure) and a voltmeter (denoted by "V" in the figure).

The input terminals in_1, in_2, in_3 . . . in_n can be used to receive an external testing signal. The output terminals out_1, out_2, out_3 . . . out_n can be used to supply a to-be-tested printed circuit board (not shown) with the external testing signal. The switches K1, K2, K3, K4 are arranged between the input terminals in_1, in_2, in_3 . . . in_n and the output terminals out_1, out_2, out_3 . . . out_n. Under control of these switches, the input terminals in_1, in_2, in_3 . . . in_n are controllably coupled to the output terminals out_1, out_2, out_3 . . . out_n. The ammeter can be used to measure a magnitude of a current on a first path provided by the coupling of the switches K1, K2, K3, K4. The voltmeter can be used to measure a magnitude of a voltage on a second path provided by the coupling of the switches K1, K2, K3, K4. The second path may or may not be the same as the first path.

In the example shown in FIG. 2, each of the plurality of first switches K1 has a terminal connected to a respective one of the plurality of input terminals in_1, in_2, in_3 . . . in_n and another terminal connected to a respective one of the plurality of output terminals out_1, out_2, out_3 . . . out_n. The second switch K2 selectively connects one of the plurality of input terminals in_1, in_2, in_3 . . . in_n to a first terminal of the ammeter. The third switch K3 selectively connects one of the plurality of output terminals out_1, out_2, out_3 . . . out_n to a second terminal of the ammeter.

In some embodiments, the second switch K2 and the third switch K3 are configured to operate such that the plurality of input terminals in_1, in_2, in_3 . . . in_n correspond one-to-one with the plurality of output terminals out_1, out_2, out_3 . . . out_n. For example, if the second switch K2 are switched to the input terminal in_1, then the third switch K3 are switched to the output terminal out_1, if the second switch K2 are switched to the input terminal in_2, then the third switch K3 are switched to the output terminal out_2, and so forth.

In some embodiments, when one of the plurality of first switches K1 is turned off, the second switch K2 and the third switch K3 are turned on such that the input terminal connected with the first switch K1 is coupled to the output terminal connected with the turned-off first switch K1 via the ammeter. In the example of FIG. 2, since the bottom first switch K1 is turned off, the second switch K2 and the third switch K3 are turned on to couple the input terminal in_1 connected with the turned-off first switch K1 to the output terminal out_1 connected with the turned-off first switch K1 via the ammeter. In other word, the plurality of first switches K1, the second switch K2 and the third switch K3 cooperate with each other to select a particular path for current test.

In some embodiments, only one of the plurality of first switches K1 is turned off at any time. As described above, the input terminal connected with the turned-off switch K1 is coupled to the corresponding output terminal by the second switch K2 and the third switch K3 via the ammeter, such that the to-be-tested printed circuit board can still work properly.

In the example shown in FIG. 2, the fourth switch K4 can be used to selectively connect one of the output terminals out_1, out_2, out_3 . . . out_n to a first terminal of the voltmeter, and a second terminal of the voltmeter can be connected to a reference terminal ref on the to-be-tested printed circuit board. This way, the voltmeter can measure a magnitude of a voltage between the path selected by the fourth switch K4 and the reference terminal ref. In an embodiment, the reference terminal may be a grounding terminal. In particular, the fourth switch K4 may be configured to operate synchronously with the second switch K2 and the third switch K3 (and potentially a corresponding one of the first switches K1), such that when the ammeter measures the magnitude of the current on a path, the voltmeter measures the magnitude of the voltage on the same path. Of course, it may not be the case in other embodiments.

In embodiments, the switches K1, K2, K3, K4 may be either mechanical switches or electronic switches. Examples of electronic switches include relays, analog switches, and the like. For example, each of the first switches K1 may be a simple single-pole single-throw (SPST) mechanical switch, or an analog switch that implements a function of SPST. And the second switch K2 may be a single-pole multiple-throw (SPMT) mechanical switch, or an analog multiplexer that implements a function of SPMT. The SPST analog switch can be controlled to be turned on or off by applying a high or low level to the control terminal thereof, and an address code can be provided to the control terminals of the analog multiplexer to select which channel of the analog multiplexer is to be turned on. Specifics of the electronic switch are known in the art, and will not be detailed herein.

Figure 3:
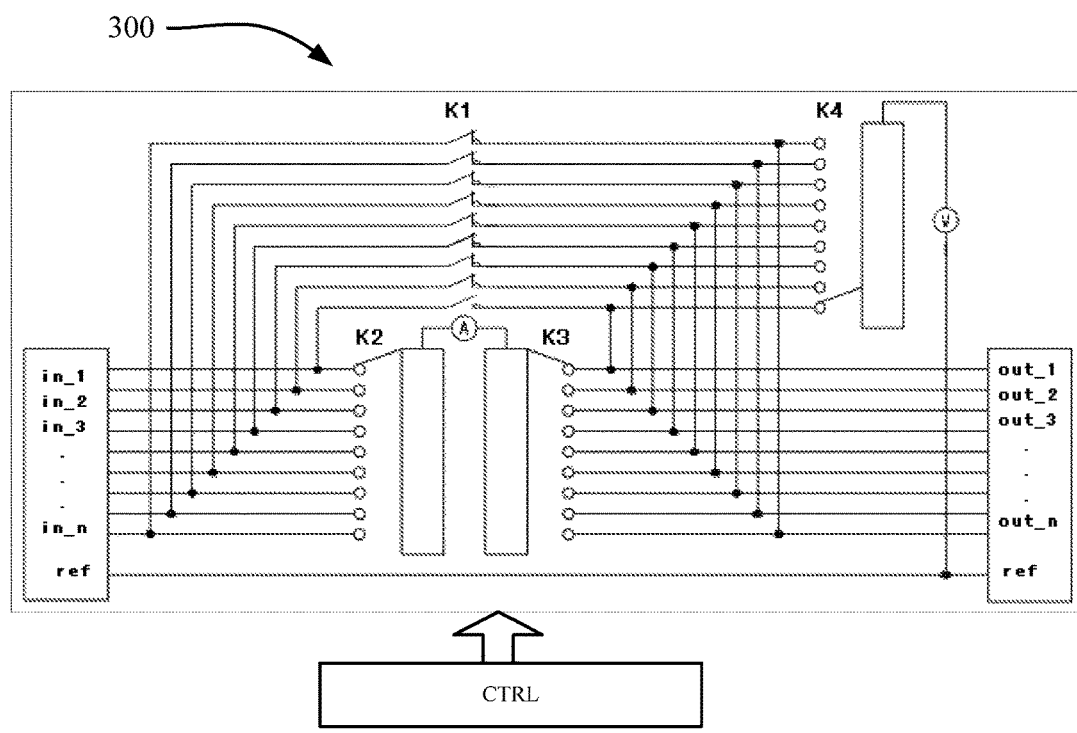
FIG. 3 shows a schematic diagram of a signal testing apparatus for a printed circuit board in accordance with another embodiment of the present disclosure.

FIG. 3 shows a schematic diagram of a signal testing apparatus 300 for a printed circuit board in accordance with another embodiment of the present disclosure. In this embodiment, all of the switches K1, K2, K3, K4 are electronic switches. For example, each of the plurality of first switches K1 can be implemented by a SPST analog switch, while the second switch K2, the third switch K3 and the forth switch K4 can each be implemented by an analog multiplexer.

As compared with the signal testing apparatus 200 shown in FIG. 2, the signal testing apparatus 300 further includes a controller CTRL, which provides the electronic switches K1, K2, K3, K4 with respective control signals for control of operations thereof. Examples of the controller CTRL include a microcontroller and an embedded processor such as a digital signal processor.

The controller CTRL can be programmed to control the switches K1, K2, K3, K4 to operate in the same way as described in the above embodiments. For example, when one of the plurality of first switches K1 is turned off, the second switch K2 and the third switch K3 are turned on such that the input terminal connected with the turned-off first switch K1 is coupled to the output terminal connected with the turned-off first switch K1 via the ammeter. That is, the plurality of first switches K1, the second switch K2 and the third switch K3 are controlled by the controller CTRL to cooperate with each other to select a particular path for current test. In addition, the fourth switch K4 can be controlled by the controller CTRL to operate synchronously with the second switch K2 and the third switch K3 (and potentially a corresponding one of the first switches K1), such that the voltmeter measures the magnitude of the voltage on a path while the ammeter is measuring the magnitude of the current on the same path.

Further, the controller CTRL can control the switches K1, K2, K3, K4 to operate such that the current and voltage of each of the paths from the input terminals in_1, in_2, in_3 . . . in_n to the output terminals out_1, out_2, out_3 . . . out_n are measured by the ammeter and the voltmeter. Measurement may be done to each of the paths in a particular order (for example, from top to bottom in the example of FIG. 2). Measurement to each path may last a predetermined period of time, for example for ease of recording measurements by the operators.

In the above description, the printed circuit board may be a printed circuit board in an LCD panel. In such a case, the external testing signals may be PG signals generated by a pattern generator. The PG signals are provided to the interfaces of the printed circuit board by the signal testing apparatus 200, 300 as described above, enabling the LCD panel to work properly. By means of the coupling of the switches K1, K2, K3, K4 of the signal testing apparatus 200, 300, the electrical characteristics (e.g., current, voltage and the like) presented at the interfaces of the printed circuit board can be measured. The measured electrical characteristics can be compared with target values to determine whether the LCD panel breaks down. It will be understood that the printed circuit board in the LCD panel are exemplary and that the signal testing apparatus 200, 300 can be applied to test other printed circuit boards.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosure set forth herein will come to mind to one skilled in the art to which these embodiments of the invention pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A signal testing apparatus for a printed circuit board, comprising:
    a plurality of input terminals for receiving an external testing signal;
    a plurality of output terminals for supplying the printed circuit board with the external testing signal;
    a plurality of switches arranged between the plurality of input terminals and the plurality of output terminals for controllably coupling the plurality of input terminals to the plurality of output terminals;
    an ammeter for measuring a magnitude of a current on a first path provided by the coupling of the plurality of switches; and
    a voltmeter for measuring a magnitude of a voltage on a second path provided by the coupling of the plurality of switches,
    wherein the plurality of switches comprises:
        a plurality of first switches each having a terminal connected to a respective one of the plurality of input terminals and another terminal connected to a respective one of the plurality of output terminals,
        a second switch for selectively connecting one of the plurality of input terminals to a first terminal of the ammeter, and
        a third switch for selectively connecting one of the plurality of output terminals to a second terminal of the ammeter,
        wherein the second switch and the third switch are configured to operate such that the plurality of input terminals corresponds one-to-one with the plurality of output terminals, and
    wherein the plurality of first switches, the second switch and the third switch are configured such that when one of the plurality of first switches is turned off, the second switch and the third switch are turned on to couple the input terminal connected with the turned-off first switch to the output terminal connected with the turned-off first switch via the ammeter.

2. The apparatus as recited in claim 1, wherein the plurality of first switches is configured such that only one of the plurality of first switches is turned off at any time.

3. The apparatus as recited in claim 1, wherein the voltmeter has a first terminal and a second terminal, the second terminal for connection to a reference terminal on the printed circuit board, and wherein the plurality of switches further comprises a fourth switch for selectively connecting one of the plurality of output terminals to the first terminal of the voltmeter.

4. The apparatus as recited in claim 3, wherein the fourth switch is configured to operate synchronously with the second switch and the third switch such that the voltmeter measures a magnitude of a voltage on the first path when the ammeter measures the magnitude of the current on the first path.

5. The apparatus as recited in claim 1, wherein the plurality of switches is selected from a group consisting of a mechanical switch and an electronic switch.

6. The apparatus as recited in claim 5, wherein the plurality of switches is a plurality of electronic switches, and wherein the signal testing apparatus further comprises a controller for controlling the electronic switches.

7. The apparatus as recited in claim 6, wherein the controller is configured to control the electronic switches to operate such that the current and voltage on each of paths from the plurality of input terminals to the plurality of output terminals are measured by the ammeter and the voltmeter.

8. The apparatus as recited in claim 1, wherein the printed circuit board is a printed circuit board in an LCD panel.

9. The apparatus as recited in claim 2, wherein the plurality of switches is selected from a group consisting of a mechanical switch and an electronic switch.

10. The apparatus as recited in claim 3, wherein the plurality of switches is selected from a group consisting of a mechanical switch and an electronic switch.

11. The apparatus as recited in claim 4, wherein the plurality of switches is selected from a group consisting of a mechanical switch and an electronic switch.

12. The apparatus as recited in claim 1, wherein the plurality of switches is electronic switches, and wherein the signal testing apparatus further comprises a controller for controlling the electronic switches.

* * * * *